(12) United States Patent
Pawlak

(10) Patent No.: US 9,978,836 B1
(45) Date of Patent: May 22, 2018

(54) NANOSTRUCTURE FIELD-EFFECT TRANSISTORS WITH ENHANCED MOBILITY SOURCE/DRAIN REGIONS

(71) Applicant: GLOBALFOUNDRIES Inc., Grand Cayman (KY)

(72) Inventor: Bartlomiej J. Pawlak, Leuven (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/344,862

(22) Filed: Nov. 7, 2016

(51) Int. Cl.
| | |
|---|---|
| *H01L 29/06* | (2006.01) |
| *H01L 29/78* | (2006.01) |
| *H01L 29/165* | (2006.01) |
| *H01L 29/205* | (2006.01) |
| *H01L 29/08* | (2006.01) |
| *H01L 29/66* | (2006.01) |

(52) U.S. Cl.
CPC ...... *H01L 29/0673* (2013.01); *H01L 29/0847* (2013.01); *H01L 29/165* (2013.01); *H01L 29/205* (2013.01); *H01L 29/66568* (2013.01); *H01L 29/78* (2013.01)

(58) Field of Classification Search
CPC ............. H01L 29/0673; H01L 29/0847; H01L 29/165; H01L 29/205; H01L 29/66568; H01L 29/78
See application file for complete search history.

(56) References Cited

U.S. PATENT DOCUMENTS

| | | | | |
|---|---|---|---|---|
| 2007/0001162 | A1* | 1/2007 | Orlowski | ............ H01L 29/7841 |
| | | | | 257/19 |
| 2014/0353574 | A1* | 12/2014 | Li | ........................ H01L 29/0673 |
| | | | | 257/9 |
| 2015/0340457 | A1* | 11/2015 | Xie | ................... H01L 29/66545 |
| | | | | 257/288 |
| 2016/0247887 | A1* | 8/2016 | Jun | ................... H01L 29/66439 |
| 2016/0260740 | A1* | 9/2016 | Degors | ............... H01L 27/1211 |
| 2017/0047404 | A1* | 2/2017 | Bentley | ............... H01L 29/1054 |

OTHER PUBLICATIONS

Silvaco, "Blaze 2D Device Simulator for Advanced Materials", product brochure, Nov. 1, 2013 [retrieved from the internet http://www.silvaco.com/products/vwf/atlas/blaze/Blaze2D_08.pdf].

* cited by examiner

*Primary Examiner* — Fernando L Toledo
*Assistant Examiner* — Neil Prasad
(74) *Attorney, Agent, or Firm* — Thompson Hine LLP; Yuanmin Cai

(57) ABSTRACT

Structures and fabrication methods for vertical-transport field-effect transistors. A nanostructure, a gate structure coupled with the nanostructure, and a source/drain region coupled with an end of the nanostructure are formed. The source/drain region is comprised of a first layer of a first semiconductor material having a first electronic band gap and a second layer of a second semiconductor material having a second electronic band gap that is wider than the first electronic band gap of the first semiconductor material.

20 Claims, 4 Drawing Sheets

NANOSTRUCTURE FIELD-EFFECT TRANSISTORS WITH ENHANCED MOBILITY SOURCE/DRAIN REGIONS

BACKGROUND

The present invention relates to semiconductor device fabrication and integrated circuits and, more specifically, to device structures for field-effect transistors, as well as methods of fabricating a device structure for a field-effect transistor.

Common transistor structures include a source, a drain, a channel situated between the source and drain, and a gate electrode configured to respond to a gate voltage by selectively connecting the source and drain to each another through the channel. Nanotechnology may represent a candidate technology that can be used to meet scaling requirements. In particular, semiconductor nanostructures, such as nanowires and nanosheets, may be attractive building blocks for the fabrication of field effect transistors. However, nanostructures may have exhibit problems with access resistance because of the limited volume of semiconductor material that is available for contacting the source/drain regions with metal contacts. The dopant in the semiconductor material of the source/drain regions may also exhibit a limited electrical activation level adjacent to the channel and to the metal contact, which can result in an elevated contact resistance.

SUMMARY

According to an embodiment, a structure for a field-effect transistor includes a nanostructure a nanostructure with a channel region, a gate structure overlapped with the channel region, and a source/drain region coupled with the channel region. The source/drain region includes a first layer of a first semiconductor material having a first electronic band gap and a second layer of a second semiconductor material having a second electronic band gap that is wider than the first electronic band gap of the first semiconductor material.

According to another embodiment, a method is provided for forming a field-effect transistor. The method includes forming a nanostructure that includes a channel region, forming a first layer of a source/drain region coupled with the channel region and comprised of a first semiconductor material having a first electronic band gap, and forming a second layer of the source/drain region coupled with the first layer of the source/drain region. The second layer is comprised of a second semiconductor material having a second electronic band gap that is wider than the first electronic band gap of the first semiconductor material. The method further includes forming a gate structure that is overlapped with the channel region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
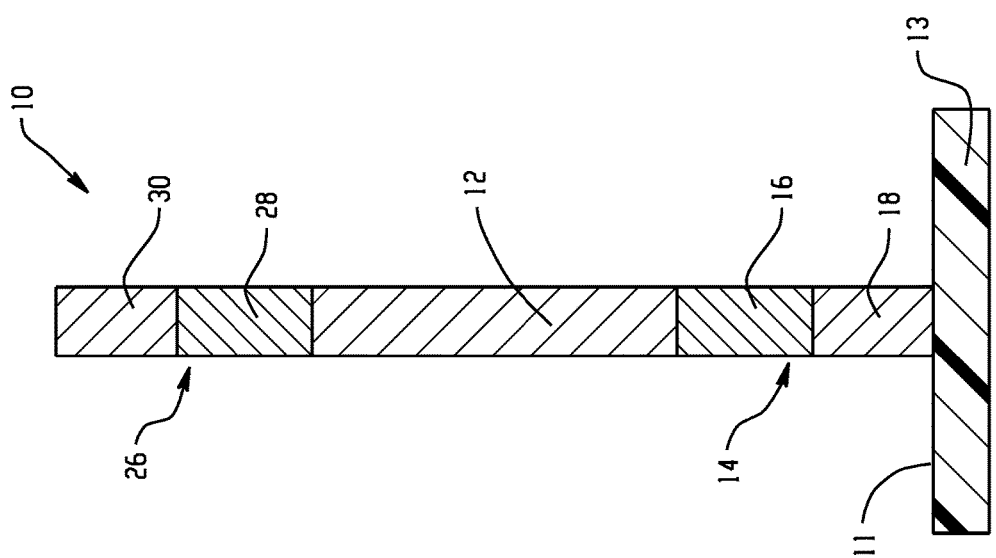

With reference to FIG. 1 and in accordance with embodiments of the invention, one or more nanostructures 10 are formed for use in fabricating a field-effect transistor. A representative embodiment will be described herein in the context of a single nanostructure 10 with an understanding that one or more additional nanostructures similar to nanostructure 10 may participate in forming the field-effect transistor. The nanostructure 10 is a three-dimensional body comprised of a semiconductor material and is located generally on a top surface 11 of a substrate 13, which may be a bulk substrate or a device layer of a semiconductor-on-insulator (SOI) substrate. The nanostructure 10 projects vertically from the top surface 11 of the substrate 13, and has an exterior sidewall that, in the representative embodiment, is vertically oriented relative to the top surface 11 of the substrate 13. The nanostructure 10 may be a nanowire having any of several suitable geometrical shapes, such as being shaped as a tube, a rod, or another elongated cylindrical structure having a width on the order of five nanometers, or less, and a length extending between its opposite ends. Alternatively, the nanostructure 10 may be constructed as a semiconductor fin or a semiconductor nanosheet.

The nanostructure 10 includes a source/drain region 14, a channel region 12, and a source/drain region 26 that have a vertical arrangement with the source/drain region 14 located proximate to the top surface 11 of the substrate 13. As used herein, the term "source/drain region" means a doped region of semiconductor material that can function as either a source or a drain of a vertical-transport field-effect transistor. The source/drain region 14 is physically and electrically coupled with one end of the channel region 12. The source/drain region 26 is physically and electrically coupled with an opposite end of the channel region 12, and is separated along the length (i.e., height) of the nanostructure 10 from the other source/drain region 14. The source/drain region 14, channel region 12, and source/drain region 26 are elements of a device structure that is a field-effect transistor.

The source/drain region 14 includes a semiconductor layer 16 and a semiconductor layer 18 that are arranged with the semiconductor layer 16 located between the semiconductor layer 18 and the channel region 12. The source/drain region 26 includes a semiconductor layer 28 and a semiconductor layer 30 that are arranged in a stack with the semiconductor layer 28 located between the semiconductor layer 30 and the channel region 12.

The source/drain region 14, channel region 12, and source/drain region 26 are formed by epitaxially growing a layer stack on the top surface 11 of the substrate 13 and patterning the layer stack using a hardmask layer and a resist layer. The resist layer may be applied to a hardmask layer formed on the semiconductor layer 30 of the source/drain region 26, exposed to a pattern of radiation projected through a photomask, and developed to form a mask that covers semiconductor layer 30 at the intended location for the nanostructure 10. The patterned resist layer is used as an etch mask for a dry etching process, such as a reactive-ion etching (ME), that patterns the hardmask layer and the layer stack to form the nanostructure 10. The etching process may be conducted in a single etching step or multiple etching steps with different etch chemistries.

The semiconductor layers 16, 28 may be formed from respective epitaxial layers of semiconductor material deposited by an epitaxial growth process with in-situ doping. A representative semiconductor material for the semiconductor layers 16, 28 is silicon-germanium (SiGe). In embodiments, the silicon-germanium constituting the semiconductor layers 16, 28 may be deposited by chemical vapor deposition (CVD) and may have a germanium concentration (i.e., the ratio of the germanium content to the germanium and silicon content) ranging from 5% to 90%. The semiconductor material of the semiconductor layers 16, 28 may be may be doped with a concentration of a p-type dopant selected from Group III of the Periodic Table (e.g., boron (B)) that is effective to impart p-type conductivity. Alternatively, the semiconductor material of the semiconductor layers 16, 28 may be doped with a concentration of an n-type dopant from Group V of the Periodic Table (e.g., phosphorus (P) or arsenic (As)) that is effective to impart n-type electrical conductivity.

The semiconductor layers 18, 30 may be formed from respective epitaxial layers of a semiconductor material selected from Group IV of the Periodic Table and deposited by an epitaxial growth process with in-situ doping. The semiconductor layers 18, 30 may have a different composition than the semiconductor layers 16, 28 such that the semiconductor material constituting the semiconductor layers 18, 30 has a different electronic band gap than the semiconductor material constituting the semiconductor layers 16, 28. In an embodiment, the semiconductor material constituting the semiconductor layers 18, 30 has a wider electronic band gap than the semiconductor material constituting the semiconductor layers 16, 28. If the semiconductor layers 16, 28 are constituted by the semiconductor material silicon-germanium from Group IV of the Periodic Table, then a representative wide band gap semiconductor material from Group IV of the Periodic Table for the semiconductor layers 18, 30 may be silicon.

The semiconductor material of the semiconductor layers 18, 30 has a conductivity type that matches (i.e., is the same as) the conductivity type of the semiconductor material of the semiconductor layers 16, 28. In an embodiment in which the semiconductor layers 16, 28 include an n-type dopant, the semiconductor material of the semiconductor layers 18, 30 may be heavily doped with a concentration of an n-type dopant from Group V of the Periodic Table (e.g., phosphorus (P) or arsenic (As)) that is effective to impart n-type electrical conductivity. in which the semiconductor layers 16, 28 include a p-type dopant, the semiconductor material of the semiconductor layers 18, 30 may be heavily doped with a concentration of a p-type dopant selected from Group III of the Periodic Table (e.g., boron (B)) that is effective to impart p-type conductivity.

The channel region 12 may be formed from an epitaxial layer of semiconductor material, such as silicon, deposited by an epitaxial growth process. The semiconductor material of the epitaxial layer used to form the channel region 12 may be undoped.

If the semiconductor layers 16, 28 are constituted by a binary semiconductor material including an element selected from Group III of the Periodic Table and an element selected from Group V of the Periodic Table, then the semiconductor layers 18, 30 may be constituted by a binary III-V or a tertiary III-V semiconductor material with a larger electronic band gap. For example, the semiconductor layers 18, 30 may be composed indium gallium arsenide (InGaAs) if the semiconductor layers 16, 28 are composed of indium arsenide. The band gap of a tertiary III-V semiconductor material may be engineered by selecting a composition and/or layering during epitaxial growth. In such embodiments, the channel region 12 may be comprised of the same semiconductor material as the semiconductor layers 16, 28.

Figure 2:
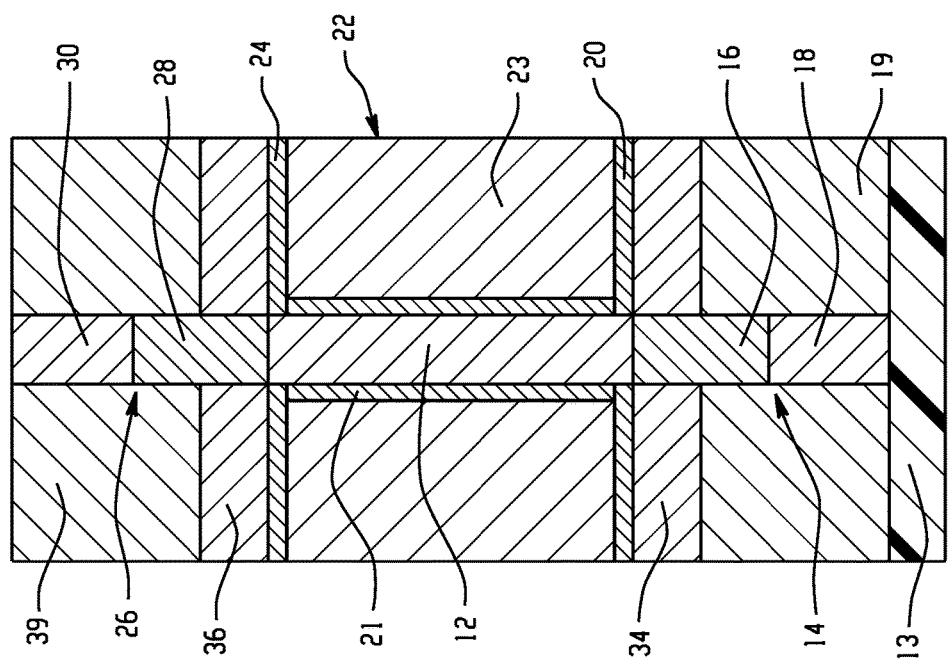
FIGS. 1 and 2 are cross-sectional views of a structure for a field-effect transistor at successive stages of a fabrication method in accordance with embodiments of the invention.

With reference to FIG. 2 in which like reference numerals refer to like features in FIG. 1 and at a subsequent fabrication stage, a dielectric layer 19 is formed on the top surface 11 of the substrate 13. The dielectric layer 19 may be comprised of a dielectric material, such as, but not limited to, silicon nitride ($Si_3N_4$) or silicon dioxide ($SiO_2$) deposited by CVD. A source/drain contact 34 is formed as a layer on the dielectric layer 19. The source/drain contact 34 is comprised of a conductor, such as a metal, and may be coupled through direct physical contact with the semiconductor layer 16. In an embodiment, the source/drain contact 34 is not in physical contact with the semiconductor layer 18.

A spacer layer 20 is formed on a top surface of the source/drain contact 34. The spacer layer 20 may be comprised of a dielectric material, such as, but not limited to, silicon nitride ($Si_3N_4$) or silicon dioxide ($SiO_2$) deposited by CVD.

A gate structure 22 of the field effect transistor is formed vertically above the spacer layer 20. The gate structure 22 is physically separated from the semiconductor layer 16 by the spacer layer 20. The gate structure 22 is located along the height of the nanostructure 10 in a spaced relationship between the source/drain region 14 and the source/drain region 24. The channel region 12 is overlapped by the gate structure 22.

The gate structure 22 includes a gate electrode 23 that is formed as a layer and a gate dielectric 21 that is applied as a thin layer to an exterior surface of the nanostructure 10 before the gate electrode 23 is formed. The gate dielectric 21 may be comprised of an electrical insulator with a dielectric constant (e.g., a permittivity) characteristic of a dielectric material. For example, the gate dielectric 21 may be comprised of a high-k dielectric material such as hafnium oxide, deposited by chemical vapor deposition (CVD), atomic layer deposition (ALD), etc. The gate electrode 23 may be comprised of one or more metals deposited by physical vapor deposition (PVD), CVD, etc. In a gate-all-around design, the gate structure 22 may be wrapped about completely about the exterior surface of the nanostructure 10 in the channel region 12.

A spacer layer 24 is formed on the top surface of the gate structure 22. The spacer layer 24 may be comprised of a dielectric material, such as, but not limited to, silicon nitride ($Si_3N_4$) or silicon dioxide ($SiO_2$) deposited by CVD.

A source/drain contact 36 is formed as a layer on the spacer layer 24. The source/drain contact 36 is comprised of a conductor, such as a metal, and may be coupled through direct physical contact with the semiconductor layer 28. In an embodiment, the source/drain contact 36 is not in physical contact with the semiconductor layer 30.

A dielectric layer 39 may be formed on a top surface of the source/drain contact 36. The dielectric layer 39 may be comprised of a dielectric material, such as, but not limited to, silicon nitride ($Si_3N_4$) or silicon dioxide ($SiO_2$) deposited by CVD.

The spacer layer 20, source/drain contacts 34, 36, the gate electrode 23, and the spacer layer 24 may each be deposited, planarized, and etched back to a designated thickness in order to locate each along the height of the nanostructure 10. The source/drain contacts 34, 36 and the gate electrode 23 may be tiered or offset in their placement such that vertical interconnections may be established.

The wider band gap of the semiconductor layer 18 and the semiconductor layer 30, in conjunction with the heavy doping, permits these semiconductor layers 18, 30 to function as respective carrier sources for carrier spillover into the respective adjacent semiconductor layers 16, 28 and to enhance the carrier mobility in the semiconductor layers 16, 18. The carrier spillover may operate to at least partially solve problems relating to access resistance between the semiconductor material in the source/drain regions 14, 26 and conductor of the source/drain contacts 34, 36. The semiconductor layers 18, 30 added to the source/drain regions 14, 26 may include a higher level of electrically-active dopant than in the associated semiconductor layers 16, 28, which contributes carriers that reduce the metal/semiconductor resistance between the semiconductor material of the semiconductor layers 16, 28 and the conductor of the source/drain contacts 34, 36. The semiconductor layers 18, 30 may reduce the Schottky barrier height between the semiconductor material of the semiconductor layers 16, 28 and the conductor of the source/drain contacts 34, 36.

Figure 3:
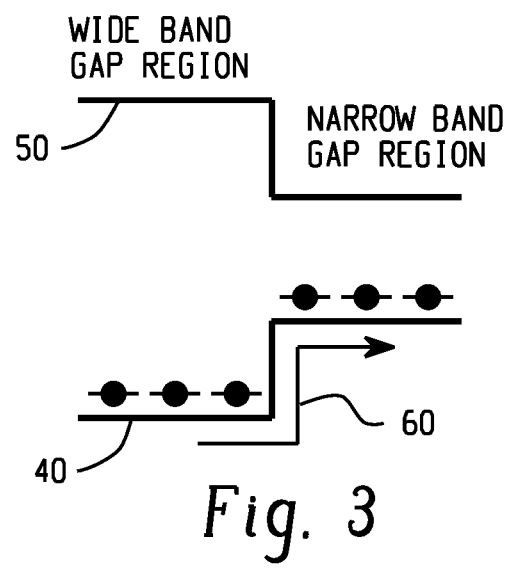
FIG. 3 is a diagrammatic view of the band structure of the semiconductor layers constituting the source/drain regions for p-type doping of the semiconductor material.
Figure 4:
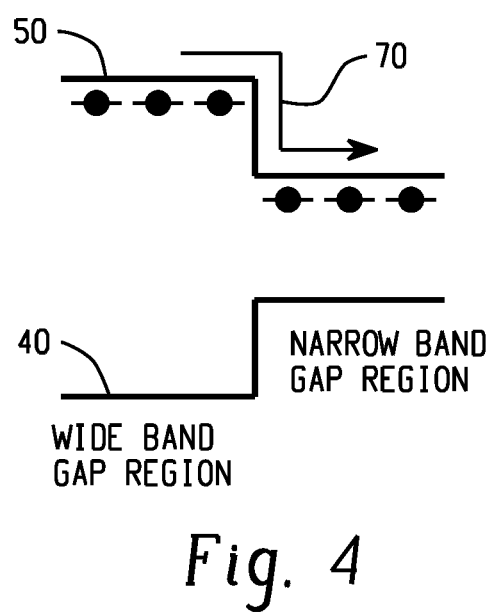
FIG. 4 is a diagrammatic view of the band structure of the semiconductor layers constituting the source/drain regions for n-type doping of the semiconductor material.

With reference to FIGS. 3 and 4, the band gap for each of the semiconductor materials constituting the semiconductor layers 16, 18, 28, 30 represents an energy difference between the top of a valence band and the bottom of a conduction band. The semiconductor material constituting the semiconductor layers 18 and 30 has an electronic band gap that is wider than the electronic bandgap of the semiconductor material constituting the semiconductor layers 16 and 28.

In an embodiment, the source/drain regions 14, 26 of the field-effect transistor may be comprised of p-type semiconductor material if used to construct a p-type field-effect transistor. As diagrammatically shown in FIG. 3 for p-type doping, the p-type semiconductor material with the wider band gap constituting the semiconductor layers 18, 30 has a larger hole concentration than electron concentration, and holes are the majority carriers. For p-type semiconductor material, the Fermi level is less than the intrinsic Fermi level and lies closer to the valence band 40 than the conduction band 50. Carrier spillover, diagrammatically indicated by reference numeral 60, occurs from the valence band 40 of the p-type semiconductor material of the semiconductor layer 18 to the valence band 40 of the p-type semiconductor material of the semiconductor layer 16, and from the valence band 40 of the p-type semiconductor material of the semiconductor layer 30 to the valence band 40 of the p-type semiconductor material of the semiconductor layer 28.

In an embodiment, the source/drain regions 14, 26 may be comprised of n-type semiconductor material if used to construct an n-type field-effect transistor. As diagrammatically shown in FIG. 4 for n-type doping, the n-type semiconductor material with the wider band gap constituting the semiconductor layers 18, 30 has a larger electron concentration than hole concentration, and electrons are the majority carriers. For n-type semiconductor material, the Fermi level is greater than the intrinsic Fermi level and lies closer to the conduction band 50 than the valence band 40. Carrier spillover, diagrammatically indicated by reference numeral 70, occurs from the conduction band 50 of the n-type semiconductor material of the semiconductor layer 18 to the conduction band 50 of the n-type semiconductor material of the semiconductor layer 16, and from the conduction band 50 of the n-type semiconductor material of the semiconductor layer 30 to the conduction band 50 of the n-type semiconductor material of the semiconductor layer 28.

The representative embodiments of the invention have been described in the context in which the field-effect transistor is a vertical transport field effect transistor in which the direction of the gated current flow is through a vertical channel in the channel region 12 connecting the source/drain regions 14, 26. The vertical channel is oriented generally perpendicular (i.e., vertical) to the top surface 11 of the substrate 13 from which the nanostructure 10 projects. However, a planar device arrangement may be included in embodiments of the invention.

Figure 5:
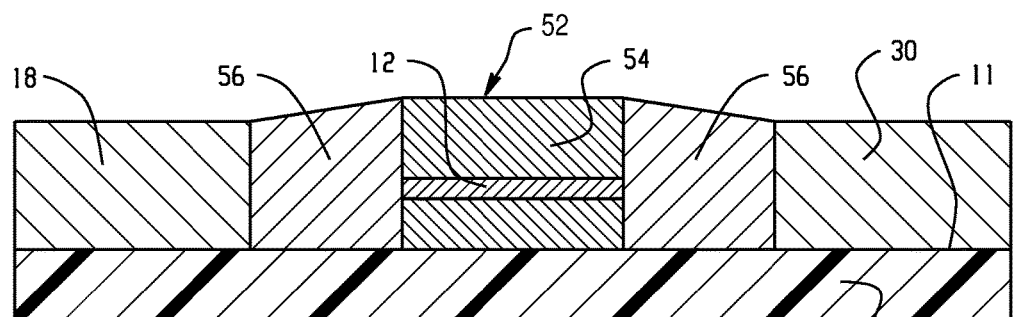
FIGS. 5-7 are cross-sectional views of a structure for a field-effect transistor at successive stages of a fabrication method in accordance with embodiments of the invention.

With reference to FIG. 5 in which like reference numerals refer to like features in FIGS. 1-4 and in accordance with embodiments of the invention, a field-effect transistor may be formed with a planar device arrangement in which the channel region 15 of the nanostructure 10 is oriented parallel (i.e., horizontal) to the top surface 11 of the substrate 13. A dummy gate structure 52 is formed that includes a layer 54 in which the channel region 12 is embedded. The material of layer 54 is chosen to be selective removable relative to the semiconductor material of the channel region 12. In an embodiment, the layer 54 may be composed of silicon-germanium and the channel region may be composed of silicon.

Spacers 56 are formed on the sidewalls of the dummy gate structure 52. The spacers 56 may be formed by depositing a conformal layer comprised of a dielectric material, such as silicon nitride ($Si_3N_4$) deposited by CVD, and shaping the conformal layer with an anisotropic etching process, such as reactive ion etching (RIE), that preferentially removes the dielectric material from horizontal surfaces. The material of the semiconductor layers 18, 30 is then deposited by selective epitaxy, as described above, on the top surface 11 of the substrate 13. The spacers 56 operate to align the deposited material of the semiconductor layers 18, 30 with the dummy gate structure 52.

Figure 6:
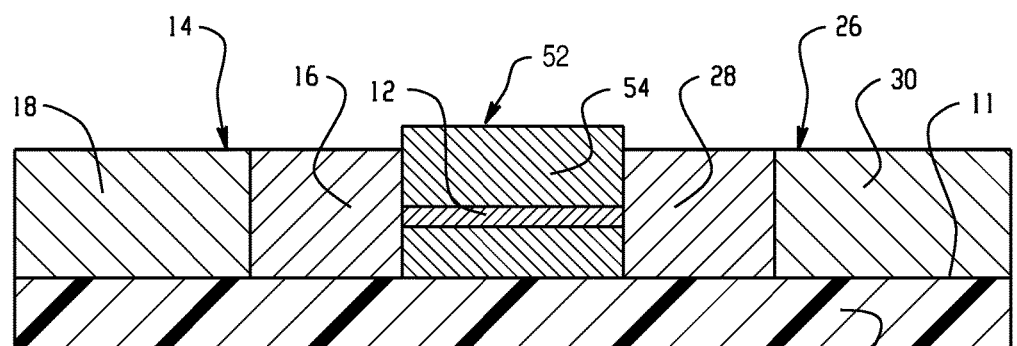

With reference to FIG. 6 in which like reference numerals refer to like features in FIG. 5 and at a subsequent fabrication stage, the spacers 56 are removed selective to the dummy gate structure 52 and to the semiconductor layers 18, 30 with an etching process. The semiconductor material of the semiconductor layers 16, 28 is then deposited by selective epitaxy, as described above, on the top surface 11 of the substrate 13 and in the respective spaces vacated by the removed spacers 56. The epitaxial growth of the semiconductor material forming the semiconductor layers 16, 28 is self-aligned by the dummy fate structure 52 and the semiconductor layers 18, 30. The semiconductor layer 16 is arranged between the semiconductor layer 18 and the channel region 12 forming the nanostructure 10, and semiconductor layer 28 is arranged between the semiconductor layer 30 and the channel region 12.

Figure 7:
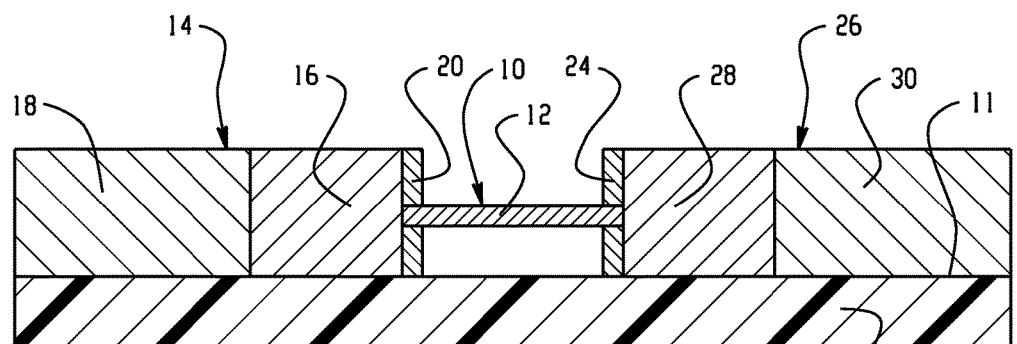

With reference to FIG. 7 in which like reference numerals refer to like features in FIG. 6 and at a subsequent fabrication stage, the layer 54 and the channel region 12 may etched using one or more hardmasks (not shown) to shape the channel region 12 and form the nanostructure 10. In an alternative embodiment, multiple nanostructures may be formed by the shaping of the channel region 12 and, after shaping, function as the channel region 12 of the field-effect transistor. In the representative embodiment, the semiconductor layers 16, 18, 28, 30 are not shaped along with the channel region 12 and are not included as sections in the construction of the nanostructure 10.

After the nanostructure 10 is formed, spacer layers 20 and 24 are formed by depositing a conformal layer comprised of a dielectric material, such as silicon dioxide (SiO$_2$) deposited by CVD, and shaping the conformal layer with an anisotropic etching process, such as reactive ion etching, that preferentially removes the dielectric material from horizontal surfaces. The spacer layers 20, 24 are located on the vertical sidewalls of the semiconductor layers 16, 28, and the nanostructure 10 penetrates through the spacer layers 20, 24.

Figure 8:
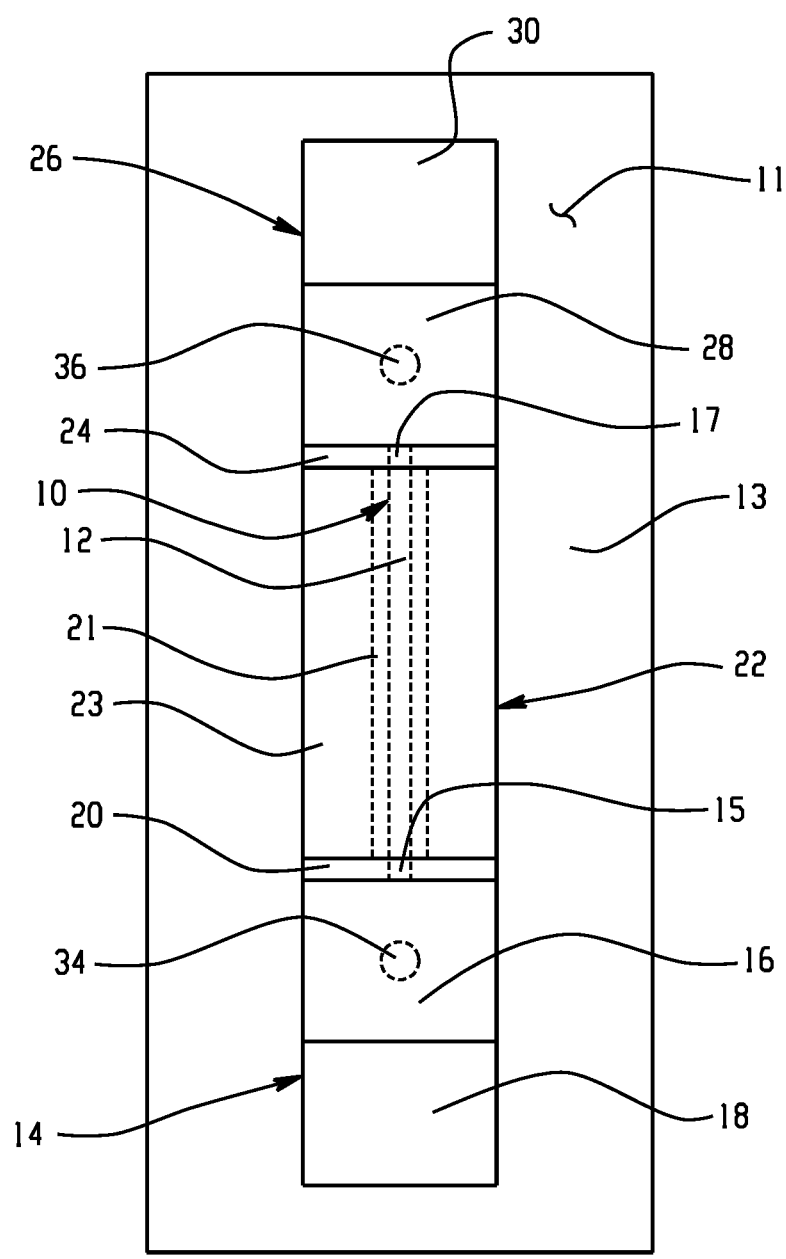
FIG. 8 is a top view of the field-effect transistor at a fabrication stage subsequent to FIG. 7.

With reference to FIG. 8 in which like reference numerals refer to like features in FIG. 7 and at a subsequent fabrication stage, the gate structure 22 is formed that overlaps the channel region 12 in the space vacated by the layer 54 of the dummy gate structure 52, and between spacer layer 20 and spacer layer 24. The gate structure 22, which includes the gate dielectric 21 and gate electrode 23, is horizontally spaced along the length of the nanostructure 10 and the channel region 12 between the source/drain region 14 and the source/drain region 26. The spacer layer 20 furnishes electrical isolation between the gate electrode 23 and the source/drain region 14, and the spacer layer 24 furnishes electrical isolation between the gate electrode 23 and the source/drain region 26. The channel region 12, which comprises the nanostructure 10, is arranged, as described above, between the semiconductor layers 16, 18 in the source/drain region 14 and the semiconductor layers 28, 30 in the source/drain region 26. The semiconductor layers 16 and 28 are respectively contacted by the source/drain contacts 34 and 36, which may extend vertically downward to contact the semiconductor layers 16, 28.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A field-effect transistor comprising:
a nanostructure including a channel region;
a gate structure overlapped with the channel region; and
a first source/drain region coupled with the channel region, the first source/drain region comprised of a first layer of a first semiconductor material having a first electronic band gap and a second layer of a second semiconductor material having a second electronic band gap that is wider than the first electronic band gap of the first semiconductor material.

2. The field-effect transistor of claim 1 wherein the first layer of the first source/drain region is arranged between the second layer of the first source/drain region and the channel region.

3. The field-effect transistor of claim 2 further comprising:
a contact coupled with the first layer of the first source/drain region.

4. The field-effect transistor of claim 1 wherein the first semiconductor material is silicon-germanium and the second semiconductor material is silicon.

5. The field-effect transistor of claim 1 wherein the first semiconductor material and the second semiconductor material include one or more elements from Group IV of the Periodic Table.

6. The field-effect transistor of claim 1 wherein the first semiconductor material is indium arsenide and the second semiconductor material is indium gallium arsenide.

7. The field-effect transistor of claim 1 wherein the first semiconductor material and the second semiconductor material each include an element selected from Group III of the Periodic Table and an element selected from Group V of the Periodic Table.

8. The field-effect transistor of claim 1 further comprising:
a contact coupled with the first layer of the first source/drain region.

9. The field-effect transistor of claim 1 further comprising:
a second source/drain region coupled with the channel region, the second source/drain region comprised of a first layer of the first semiconductor material and a second layer of the second semiconductor material, and the channel region arranged between the first source/drain region and the second source/drain region.

10. The field-effect transistor of claim 9 further comprising:
a first contact coupled with the first source/drain region; and
a second contact coupled with the second source/drain region.

11. The field-effect transistor of claim 9 further comprising:
a first contact coupled with the first layer of the first source/drain region; and
a second contact coupled with the first layer of the second source/drain region.

12. The field-effect transistor of claim 1 wherein the nanostructure is a nanowire, and the first semiconductor material and the second semiconductor material are doped to have the same conductivity type.

13. The field-effect transistor of claim 1 wherein the nanostructure is supported on a top surface of a substrate, and the channel region is oriented vertically relative to the top surface.

14. The field-effect transistor of claim 1 wherein the nanostructure is supported on a top surface of a substrate, and the channel region is oriented horizontally relative to the top surface.

15. A method of forming a field effect transistor, the method comprising:
    forming a nanostructure that includes a channel region;
    forming a first layer of a first source/drain region coupled with the channel region and comprised of a first semiconductor material having a first electronic band gap;
    forming a second layer of the first source/drain region coupled with the first layer of the first source/drain region and that is comprised of a second semiconductor material having a second electronic band gap that is wider than the first electronic band gap of the first semiconductor material; and
    forming a gate structure that is overlapped with the channel region.

16. The method of claim 15 further comprising:
    forming a contact coupled with the first layer of the first source/drain region.

17. The method of claim 15 further comprising:
    forming a second source/drain region coupled with the channel region,
    wherein the second source/drain region is comprised of a first layer of the first semiconductor material and a second layer of the second semiconductor material.

18. The method of claim 17 further comprising:
    forming a first contact coupled with the first layer of the first source/drain region; and
    forming a second contact coupled with the first layer of the second source/drain region.

19. The method of claim 15 wherein the nanostructure is supported on a top surface of a substrate, and the channel region is oriented vertically relative to the top surface.

20. The method of claim 15 wherein the nanostructure is supported on a top surface of a substrate, and the channel region is oriented horizontally relative to the top surface.

* * * * *